United States Patent [19]
Ogawa et al.

[11] Patent Number: 5,436,573
[45] Date of Patent: Jul. 25, 1995

[54] HIGH-SPEED SEMICONDUCTOR INTEGRATED CIRCUIT DEVICE WITH REDUCED DELAY IN GATE-TO-GATE WIRING

[75] Inventors: Rokutarou Ogawa; Taichi Saitoh; Tosiaki Sakai, all of Kawasaki, Japan

[73] Assignee: Fujitsu Limited, Kawasaki, Japan

[21] Appl. No.: 113,828

[22] Filed: Aug. 31, 1993

[30] Foreign Application Priority Data

Mar. 2, 1993 [JP] Japan .................. 5-041303

[51] Int. Cl.⁶ ............... H03K 19/00; H01L 25/00
[52] U.S. Cl. .................. 326/17; 326/15;
326/93; 326/101; 326/21; 327/565; 327/374; 327/382; 327/395
[58] Field of Search ............ 307/443, 455, 303.1,
307/482.1; 257/923; 326/17, 15, 9, 93, 101, 41, 47, 21; 327/382, 374, 395, 403, 564, 565

[56] References Cited

U.S. PATENT DOCUMENTS

| | | | |
|---|---|---|---|
| 4,475,119 | 10/1984 | Kuo et al. | 307/303.1 |
| 4,849,932 | 7/1989 | Yonezu | 257/923 |
| 4,883,980 | 11/1989 | Morimoto et al. | 307/303.1 |
| 4,992,981 | 2/1991 | Ganssloser et al. | 365/205 |
| 5,089,862 | 2/1992 | Warner, Jr. et al. | 307/468 |
| 5,306,967 | 4/1994 | Dow | 307/482.1 |

OTHER PUBLICATIONS

Hodges et al., "Analysis And Design of Digital Integrated Circuits", 1983, pp. 274–275, 292–293, 416–417, McGraw Hill.

Meiksin et al., "Electronic Design With Off-The-Shelf Integrated Circuits", 1983, p. 304, Prentice Hall, Inc.

*Primary Examiner*—Edward P. Westin
*Assistant Examiner*—Richard Roseen
*Attorney, Agent, or Firm*—Staas & Halsey

[57] ABSTRACT

A semiconductor integrated circuit device has a first wire for transmitting a first signal and a second wire adjacent to the first wire, for transmitting a second signal having the stronger probability of having an opposite phase to that of the first signal. A space between the first and second wires is wider than a standard wiring space, to reduce a delay in the operation speed of the device due to wiring capacitance produced between the first and second wires.

15 Claims, 8 Drawing Sheets

DIFFERENTIAL WIRING
INPUT TERMINALS
81
82

Fig. 3B

INPUT TERMINAL
83
84
DIFFERENTIAL WIRING
OUTPUT TERMINALS

HIGH-SPEED SEMICONDUCTOR INTEGRATED CIRCUIT DEVICE WITH REDUCED DELAY IN GATE-TO-GATE WIRING

BACKGROUND OF THE INVENTION

1. Field of the Invention

The present invention relates to a semiconductor IC (integrated circuit) device, and particularly, to a gate-to-gate wiring technique for super-high-speed semiconductor IC devices.

2. Description of the Related Art

Progress in semiconductor processing has produced very fine wiring and high-speed gates. In such high-speed gates, a delay caused by capacitance in gate-to-gate wiring becomes significant relative to the operational speed of the gates. It is required, therefore, to provide a semiconductor IC device that has a small delay in gate-to-gate wiring and operates at high speed.

SUMMARY OF THE INVENTION

An object of the present invention is to reduce a delay in gate-to-gate wiring of a semiconductor IC device and improve the operational speed of the device.

According to the present invention, there is provided a semiconductor integrated circuit device comprising a first wire for transmitting a first signal; a second wire, adjacent to the first wire, for transmitting a second signal having the strong probability of having an opposite phase to that of the first signal; and a space wider than a standard wiring space, formed between the first and second wires, for reducing a delay in the operation speed of the semiconductor integrated circuit device due to wiring capacitance produced between the first and second wires.

The first signal and second signal may be complementary signals. The complementary signals may be complementary clock signals. The complementary signals may be OR and NOR outputs of an OR/NOR gate, or AND and NAND outputs of an AND/NAND gate.

The space between the first wire and the second wire may be twice as wide as the standard wiring space; and the semiconductor integrated circuit device may further comprise a third wire, formed between the first and second wires, for holding a third signal having a fixed potential level while the first and second signals are being provided. The third wire may be a test wire to be used only during a test.

The semiconductor integrated circuit device may further comprise a fourth wire for transmitting a fourth signal having the strong probability of having the same phase as that of the first signal transmitted through the first wire; and the first and fourth wires may be arranged adjacent to each other. The first wire may transmit an OR or a NOR output of a first OR/NOR gate, and the fourth wire may transmit an OR or a NOR output of a second OR/NOR gate that receives the same signal as that to the first OR/NOR gate. The fist wire may transmit an AND or a NAND output of a first AND/NAND gate, and the fourth wire may transmit an AND or a NAND output of a second AND/NAND gate that receives the same signals as the first AND/NAND gate. The semiconductor integrated circuit device may have a multilayer wiring structure, the first and fourth wires may be arranged in adjacent wiring layers, and the first and fourth wires in the adjacent wiring layers may intersect each other, or run in parallel with each other.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior art will be explained.

IC devices are increasingly miniaturized and integrated. Wiring pitches are narrowed and a space between adjacent wires is shortened, accordingly.

Figure 1A:
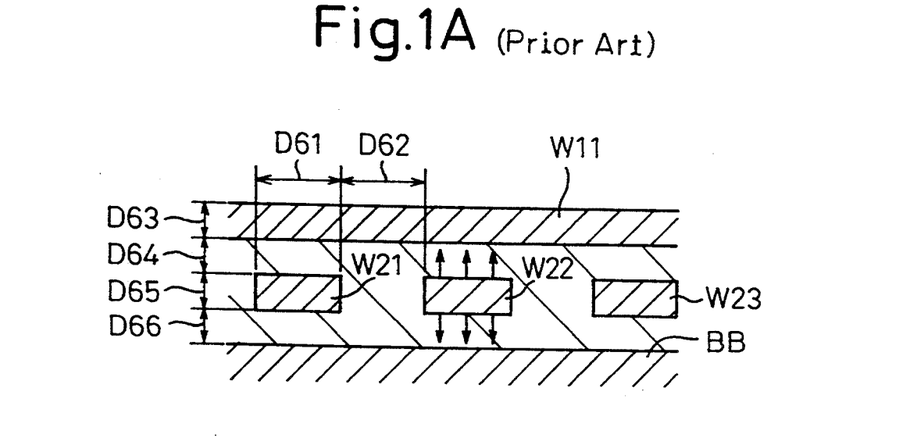
FIGS. 1A and 1B explain the problems of a semiconductor IC device employing conventional wiring.
Figure 1B:
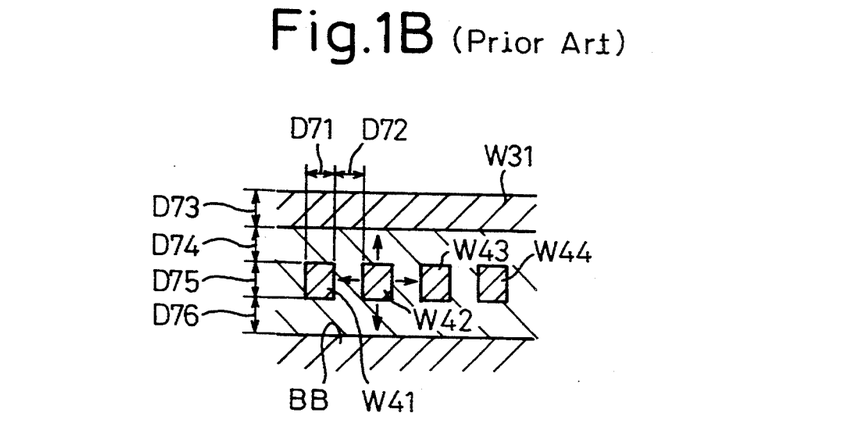

FIGS. 1A and 1B explain the problems of conventional wiring in semiconductor IC devices, in which FIG. 1A is a section showing conventional multilayer wiring, and FIG. 1B is a section showing another conventional multilayer wiring.

In FIG. 1A, the thickness D63 of a first wiring layer involving an upper wire W11 and the thickness D65 of a second wiring layer involving lower wires W21, W22, and W23 are each one micrometer. A space D64 between the first and second wiring layers and a space D66 between the second wiring layer and a bulk BB are each one micrometer. The width D61 of the wire W21 (W22, W23) is three micrometers. A space D62 between, for example, the wires W21 and W22 is three micrometers.

In this conventional semiconductor IC device, the influence of parasitic capacitance produced in the short vertical space between the wiring layers has been a problem. The influence of parasitic capacitance produced in a wide horizontal space between wires, however, has not been a problem.

In FIG. 1A, arrow marks represent electric lines of force. The number of the arrow marks is proportional to the strength of parasitic capacitance (wiring capacitance). The width D71 of each wire in FIG. 1B is one micrometer, which is one third of the wire width D61 of FIG. 1A that is three micrometers. The wiring capacitance of FIG. 1B, however, is only about two thirds of FIG. 1A.

In FIG. 1B, the thickness D73 of a first wiring layer involving a wire W31 and the thickness D75 of a second wiring layer involving wires W41, W42, W43, and W44 are each one micrometer. A space D74 between the first and second wiring layers and a space D76 between the second wiring layer and a bulk BB are each one micrometer. A space D72 between the adjacent wires (for example, between the wires W41 and W42) is one micrometer. In the semiconductor device of FIG. 1B, not only parasitic capacitance produced in the vertical spaces between the wiring layers, but also parasitic capacitance produced in horizontal spaces between the wires, will be a problem.

Figure 2:
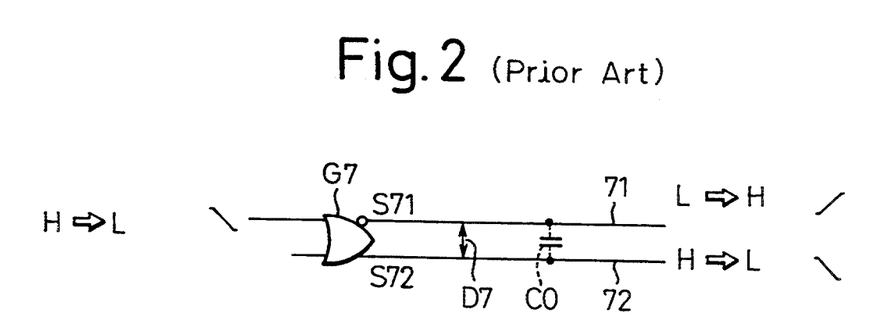
FIG. 2 is a circuit diagram showing a conventional semiconductor IC device.

FIG. 2 is a circuit diagram showing a conventional semiconductor IC device. A reference mark G7 is an OR/NOR gate, 71 and 72 are wires for transmitting complementary signals having opposite phases provided by the NOR output terminal S71 and OR output terminal S72 of the OR/NOR gate G7, and C0 is parasitic capacitance produced between the adjacent wires 71 and 72. The OR/NOR gate G7 forms, with other gates, a critical path.

When an input to the OR/NOR gate G7 changes from level HIGH to level LOW, the NOR output S71 changes from LOW to HIGH, while the OR output S72 changes from HIGH to LOW. A space D7 between the wires 71 and 72 is a standard wiring space of, for example, one micrometer. The standard wiring space is employed for forming a basic grid in semiconductor manufacturing processes.

When signals having opposite phases are supplied to the adjacent wires 71 and 72, the magnitude of a voltage change between the wires 71 and 72 is twice as large as a potential difference between the levels LOW and HIGH. This voltage change and parasitic capacitance C0 between the adjacent wires deteriorate the operation speed of the device.

FIGS. 3A to 5 show examples of locations for supplying complementary signals having opposite phases to adjacent wires such as the wires 71 and 72 mentioned above.

Figure 3A:
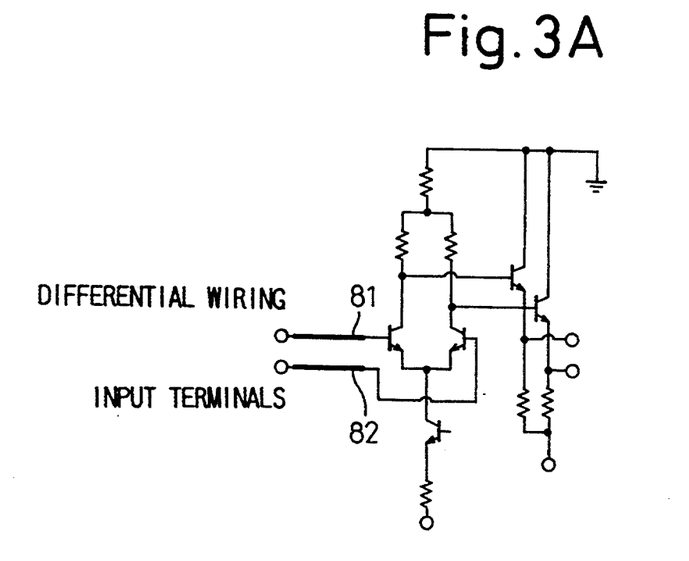
FIGS. 3A and 3B are circuit diagrams showing differential I/O gates employing differential wiring.
Figure 3B:
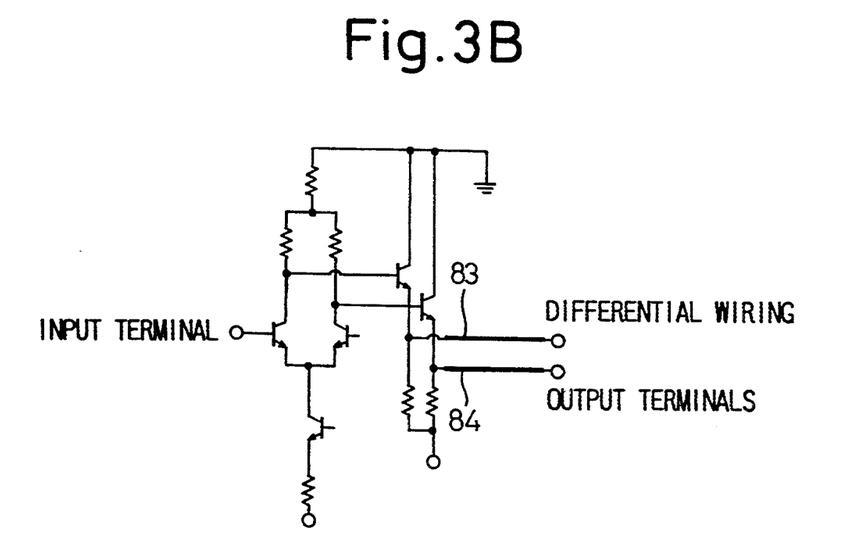

In FIG. 3A, wires 81 and 82 at a differential input gate of an ECL circuit correspond to the wires 71 and 72 of FIG. 2. In FIG. 3B, wires 83 and 84 at a differential output gate of an ECL circuit also correspond to the wires 71 and 72 of FIG. 2.

Figure 4:
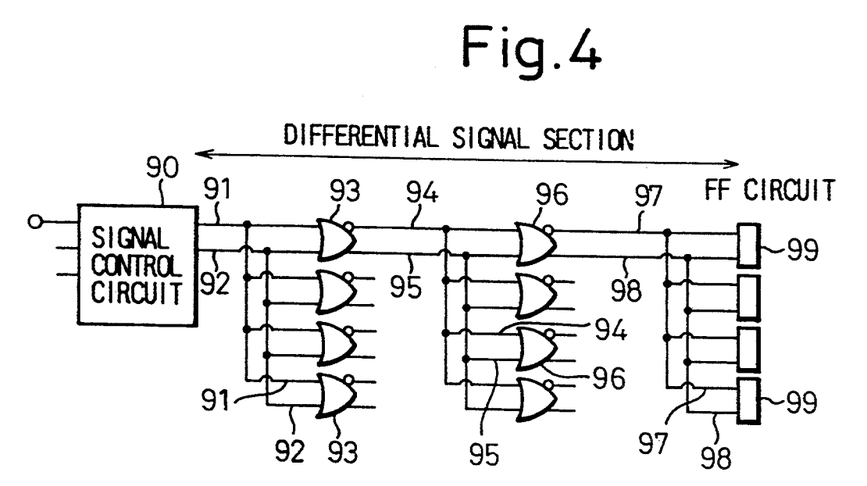
FIG. 4 is a logic circuit diagram showing a clock signal distribution system employing differential wiring.

FIG. 4 is a logic circuit diagram showing a clock signal distribution system. Outputs of a signal control circuit 90 are branched through OR/NOR gates 93 and 96 and are supplied to flip-flop circuits 99. Wires 91 and 92 for transmitting complementary output signals (clock signals) of the signal control circuit 90 to the first OR/NOR gates 93, wires 94 and 95 for transmitting complementary output signals (NOR and OR outputs) of the OR/NOR gates 93, and wires 97 and 98 for transmitting complementary output signals (NOR and OR outputs) of the OR/NOR gates 96 correspond to the wires 71 and 72 of FIG. 2.

Figure 5:
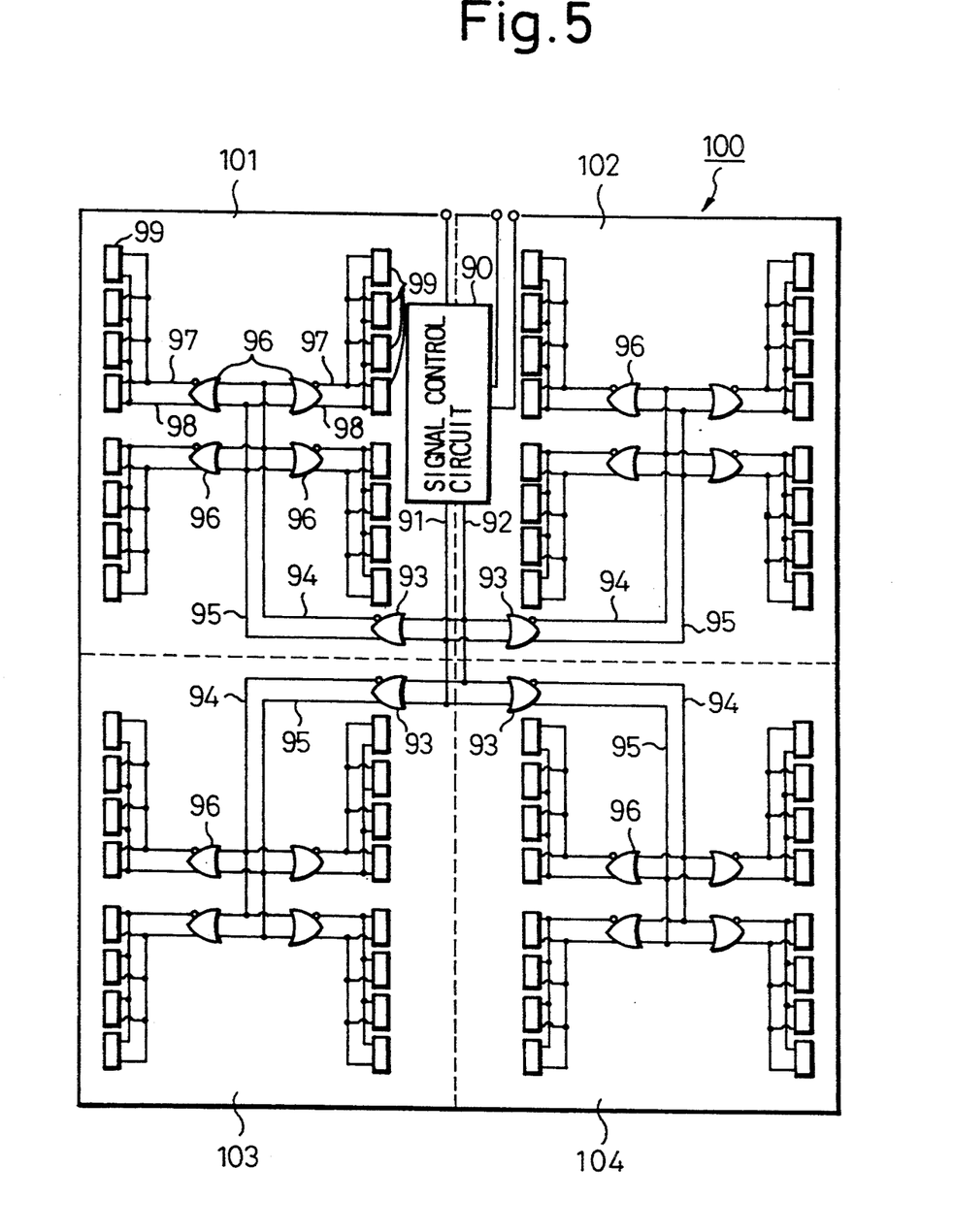
FIG. 5 shows a clock signal distribution system formed on a chip, employing differential wiring.

FIG. 5 shows a clock signal distribution system formed on a chip 100. The chip 100 is composed of four blocks 101 to 104. An output (a clock signal) of a signal control circuit 90 is branched to the blocks 101 to 104 and supplied to flip-flops 99 of each of the blocks. Each of the blocks 101 to 104 has the same arrangement as the arrangement of FIG. 4. Wires 91 and 92, 94 and 95, and 97 and 98 correspond to the wires 71 and 72 of FIG. 2 for transmitting complementary signals.

The present invention is not limited to wires for transmitting complementary signals. It is applicable for wiring locations whose probability of transferring signals of opposite phase is strong.

When signals having opposite phase are supplied to the adjacent wires 71 and 72 of FIG. 2, a voltage change between the wires 71 and 72 becomes twice as large as a potential difference between levels LOW and HIGH. This large voltage difference and parasitic capacitance C0 between the adjacent wires deteriorate the operation speed of the device. The prior art does not consider this kind of logical phase relationship in wiring. Even in a critical path, the prior art arranges wiring involving opposite phases to cause a delay and deteriorate the performance of the device.

In the semiconductor IC device of FIG. 2, the time necessary for completing a potential change at both ends of the parasitic capacitance C0 determines the delay of the wiring. Namely, the potential change v is obtained by dividing an integration Q of a current i by a capacitance value C0, as follows:

$$v = i/C0 \, dt$$

Accordingly, to obtain a large potential change, a large current must be supplied, or a long time is needed.

When the current to the wiring, i.e., a gate driving current is increased to rapidly charge or discharge the wiring capacitance, i.e., parasitic capacitance in the gate-to-gate wiring, power consumption increases. For example, several hundred watts are necessary in a whole system having a plurality of semiconductor IC devices. This causes trouble in power consumption and heat radiation. When the potential change takes a long time to complete, it slows the switching speed of logic gates, to deteriorate the performance of the device.

Super-large computers employ very-high-speed logic circuits that employ high-speed gates. In such high-speed gates, a delay in gate-to-gate wiring becomes conspicuous relative to the operation speed of the gates.

Now, semiconductor IC devices according to the embodiments of the present invention will be explained with reference to the drawings.

Figure 6:
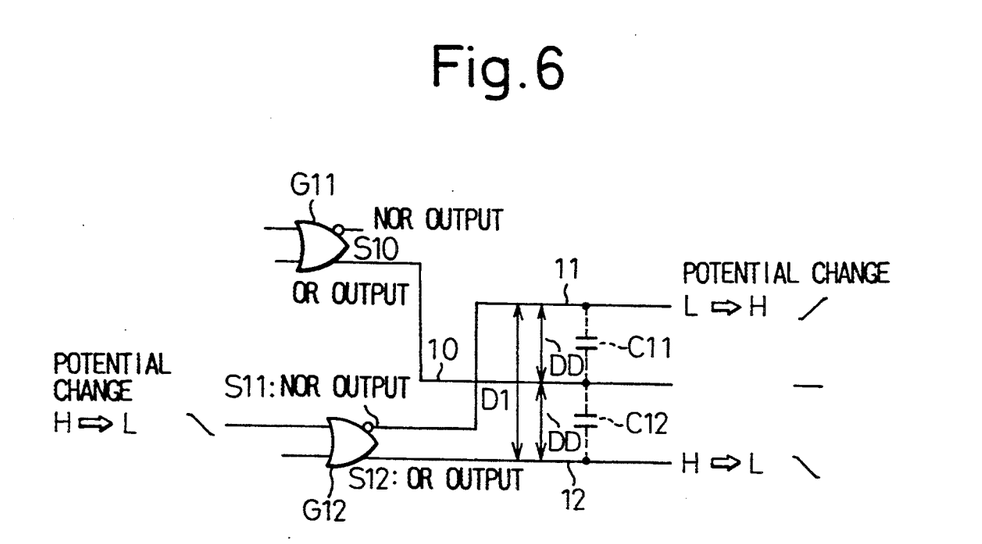
FIG. 6 is a circuit diagram showing a semiconductor IC device according to a first embodiment of the present invention.

FIG. 6 is a circuit diagram showing a semiconductor IC device according to the first embodiment of the present invention. Reference marks G11 and G12 are OR/NOR gates, 11 and 12 are wires for transmitting complementary signals having opposite phases provided by the NOR output terminal S11 and OR output terminal S12 of the OR/NOR gate G12, and 10 is a wire for transmitting an OR output S10 of the OR/NOR gate G11.

A space between the wires 11 and 12 is twice as wide as a standard wiring space DD. The wire 10 is arranged between the wires 11 and 12. A signal supplied to the wire 10 has an intermediate potential level between the levels of the complementary signals that are supplied to the wires 11 and 12 when the gate G12 is active.

When one of the input signals to the OR/NOR gate G12 changes from level HIGH to level LOW, the NOR output S11 of the gate G12 changes from LOW to HIGH, and the OR output S12 of the gate G12 changes from HIGH to LOW. When the gate G12 is active, the potential of the wire 10 is fixed, so that a potential change between the wires 10 and 11 and a potential change between the wires 10 and 12 is equal to an amplitude change (a voltage change from HIGH to LOW, or a voltage change from LOW to HIGH).

In this way, the semiconductor IC device of FIG. 6 fixes the level of an end of capacitance C11 (C12) connected to the wire 10 and changes the level of the other end of the capacitance connected to the wire 11 (12). Accordingly, a potential change of this IC device is half of that of the prior art, and therefore, a period to complete the change is also half of that of the prior art. Namely, the present invention is capable of reducing a delay caused by capacitance in wiring without increasing power consumption, to thereby improve the operation speed of the device.

Figure 7:
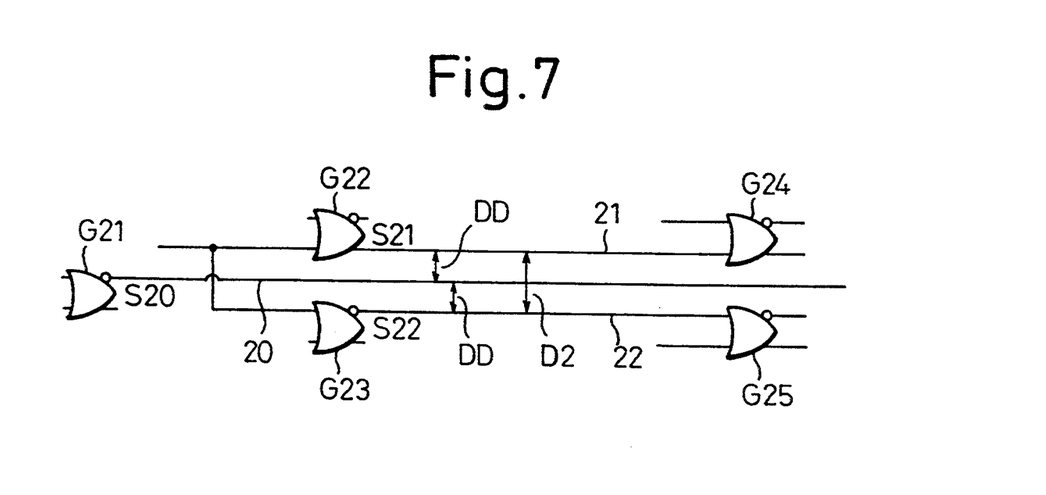
FIG. 7 is a circuit diagram showing a semiconductor IC device according to a second embodiment of the present invention.

FIG. 7 is a circuit diagram showing a semiconductor IC device according to the second embodiment of the present invention.

According to the first embodiment of FIG. 6, the wire 10 is disposed between the wires 11 and 12 that transmit complementary output signals (S11, S12) from a single OR/NOR gate (G12). According to the second embodiment of FIG. 7, complementary signals are provided from two OR/NOR gates G22 and G23 that receive the same input signal.

A space between a wire 21 for transmitting an OR output S21 of the OR/NOR gate G22 and a wire 22 for transmitting a NOR output S22 of the OR/NOR gate G23 is twice as wide as the standard wiring space DD. A wire 20 is arranged between the wires 21 and 22, to transmit a NOR output S20 of an OR/NOR gate G21. This NOR output S20 is used, for example, only for testing. Namely, the wire 20 is a test wire to be used only for testing. During a normal operation in which the levels of the wires 21 and 22 change, the level of the wire 20 is unchanged or floating.

Figure 8:
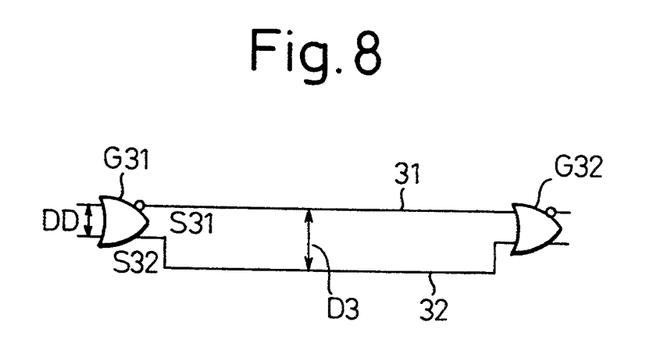
FIG. 8 is a circuit diagram showing a semiconductor IC device according to a third embodiment of the present invention.

FIG. 8 is a circuit diagram showing a semiconductor IC device according to the third embodiment of the present invention.

According to the first embodiment of FIG. 6, the wire 10 is arranged between the wires 11 and 12 that transmit complementary output signals (S11, S12) from a single OR/NOR gate (G12). According to the third embodiment of FIG. 8, a space D3 between wires 31 and 32 for transmitting complementary output signals S31 and S32 of an OR/NOR gate G31 is wider than the standard wiring space DD, and no wire is arranged between the wires 31 and 32. The wires 31 and 32 for transmitting the complementary signals S31 and S32 are connected to input terminals of an OR/NOR gate G32 of the next stage. Input wires of the OR/NOR gate G31 and output wires of the OR/NOR gate G32 may also be distanced wider than the standard wiring space DD.

Figure 9:
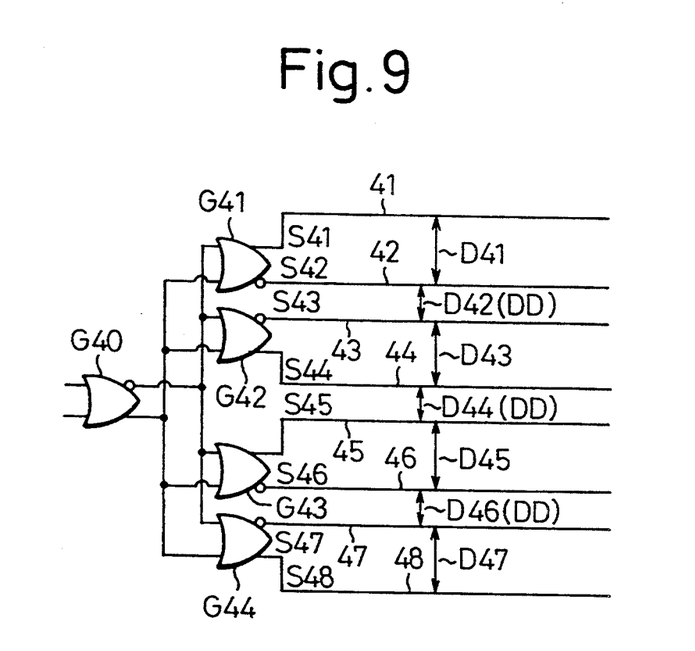
FIG. 9 is a circuit diagram showing a semiconductor IC device according to a fourth embodiment of the present invention.

FIG. 9 is a circuit diagram showing a semiconductor IC device according to the fourth embodiment of the present invention.

A space between wires for transmitting signals having opposite phases of each OR/NOR gate is wider than the standard wiring space. A space between wires for transmitting signals having the same phase of the OR/NOR gates is equal to the standard wiring space.

More precisely, input terminals of OR/NOR gates G41 to G44 commonly receive complementary output signals of an OR/NOR gate G40. The OR/NOR gates G41 to G44 provide synchronous signals. A space D42 between a wire 42 for transmitting a NOR output S42 of the OR/NOR gate G41 and a wire 43 for transmitting a NOR output S43 of the OR/NOR gate G42 is equal to the standard wiring space DD because the NOR outputs S42 and S43 have the same phase. Similarly, a space D44 between a wire 44 for transmitting an OR output S44 of the OR/NOR gate G42 and a wire 45 for transmitting an OR output S45 of the OR/NOR gate G43, and a space D46 between a wire 46 for transmitting a NOR output of the OR/NOR gate G43 and a wire 47 for transmitting a NOR output S47 of the OR/NOR gate G44 are each equal to the standard wiring space DD. The reason why the wires for transmitting signals having the same phase are arranged with the standard wiring space DD is because there is no potential difference between these wires (for example, between the wires 42 and 43). Namely, even if they are formed adjacent to each other, there will be no delay due to parasitic capacitance between the wires.

The OR output S41 and NOR output S42 of the OR/NOR gate G41 are complementary signals having opposite phases, so that a space between the wires 41 and 42 for transmitting the OR output S41 and NOR output S42 is wider than (for example, twice) the standard wiring space DD. Similarly, a space D43 between the wires 43 and 44 for transmitting the NOR output S43 and OR output S44 of the OR/NOR gate G42, a space D45 between the wires 45 and 46 for transmitting the OR output S45 and NOR output S46 of the OR/NOR gate G43, and a space D47 between the wires 47 and 48 for transmitting the NOR output S47 and OR output S48 of the OR/NOR gate G47 are each wider than (for example, twice) the standard wiring space DD.

Similar to the embodiment of FIG. 6, a wire such as a test wire whose level is fixed while the gates G41 to G44 are active may be arranged in each of the wiring spaces D41, D43, D45, and D47 each of which is twice as wide as the standard wiring space DD.

In this way, optimum wire-to-wire spaces are respectively defined for wires that do not logically have opposite phases but have the strong probability of having opposite phases in actual use and for wires that do not logically have the same phase but have the strong probability of having the same phase in actual use.

More precisely, a logic simulation is carried out to find wires that have the strong probability of having opposite phases in actual operation. The logic simulation is carried out with a given input signal pattern, to extract terminals that will involve opposite phases. The simulation is repeated with different input signal patterns, to select terminals involving opposite phases and determine objective wires.

Another method carries out a logic simulation with a given input signal pattern, to extract terminals involving opposite phases. The extracted terminals are weighted. The simulation is repeated with different input signal patterns, and extracted terminals are weighted each time. Finally, terminals each having a weighted value above a predetermined level are selected among the extracted terminals, to determine objective wires.

Figure 10A:
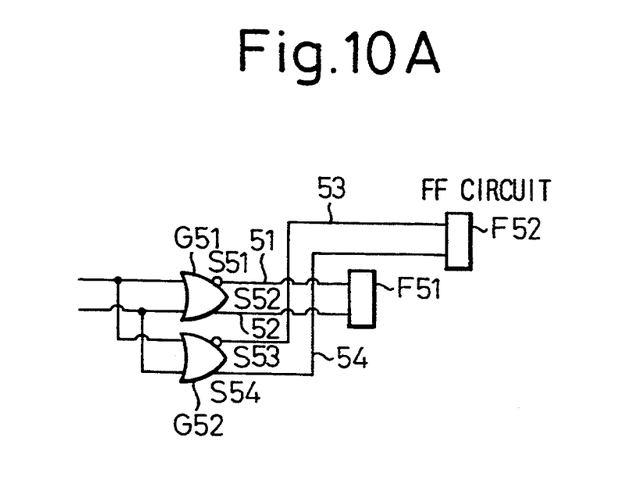
FIGS. 10A and 10B are circuit diagrams showing a semiconductor IC device according to a fifth embodiment of the present invention and a conventional semiconductor IC device.
Figure 10B:
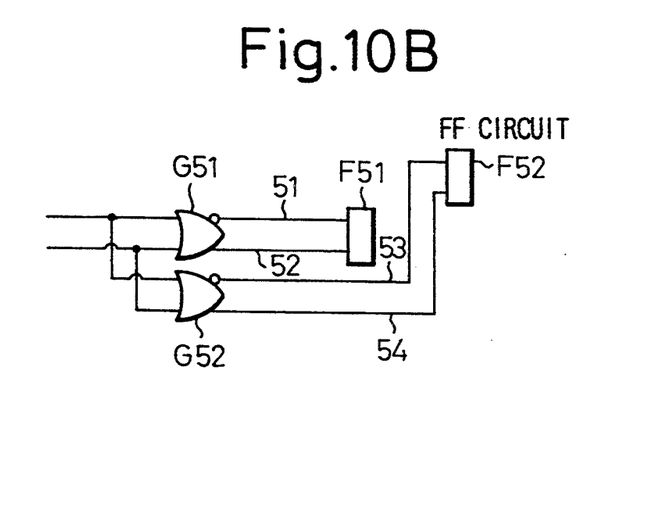

FIG. 10A shows a conventional multilayer semiconductor IC device, and FIG. 10B shows a multilayer semiconductor IC device according to a fifth embodiment of the present invention.

According to the fifth embodiment, wires that are formed in adjacent wiring layers and transmit signals having opposite phases, or having the strong probability of having opposite phases in operation are arranged so as not to intersect each other.

More precisely, a NOR output S51 of an OR/NOR gate G51 and an OR output S54 of an OR/NOR gate G52 have opposite phases, and therefore, wires 51 and 54 that transmit these signals are arranged so as not to intersect each other. Similarly, an OR output S52 of the OR/NOR gate G51 and a NOR output S53 of the OR/NOR gate G52 have opposite phases, so that wires 52 and 53 that transmit these signals are arranged so as not to intersect each other. The fifth embodiment of the present invention arranges and connects the wires for the OR/NOR gates G51 and G52 and flip-flops F51 and F52 in this way.

According to the present invention, not only wires that are adjacent to each other on the same plane, i.e., in the same wiring layer but also wires that are three-dimensionally adjacent to each other in vertically adjacent wiring layers are arranged in consideration of the characteristics of signals transmitted through the wires. This results in reducing a delay caused by parasitic capacitance produced in gate-to-gate wiring and improving an operation speed.

The OR/NOR gates explained with the above embodiments form critical paths. Although the above embodiments relate to wires for transmitting OR and NOR outputs of OR/NOR gates, the present invention is not limited to the OR and NOR output wires. For example, the present invention is applicable for wires for transmitting AND and NAND outputs of AND/NAND gates.

As explained above in detail, a semiconductor IC device according to the present invention reduces a potential change applied to the wiring capacitance of objective gate-to-gate wires of a logic circuit, to reduce a delay due to the wiring capacitance, improve the operation speed of the device without increasing power consumption, and raise the performance of the device.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit device comprising:
   a first wire for transmitting a first signal;
   a second wire, adjacent to said first wire, said second wire having a capability for transmitting a second signal having an opposite phase to that of said first signal;
   a space formed between said first and second wires, said space being sufficiently large to reduce a delay in the operation speed of said semiconductor integrated circuit device due to wiring capacitance produced between said first and second wires; and
   a third wire formed between said first and second wires for maintaining a third signal having a fixed potential level while the first and second signals are being transmitted.

2. A semiconductor integrated circuit device as claimed in claim 1, wherein the first signal and second signal are complementary signals.

3. A semiconductor integrated circuit device as claimed in claim 2, wherein the complementary signals are complementary clock signals.

4. A semiconductor integrated circuit device as claimed in claim 2, wherein the complementary signals are OR and NOR outputs of an OR/NOR gate.

5. A semiconductor integrated circuit device as claimed in claim 2, wherein the complementary signals are AND and NAND outputs of an AND/NAND gate.

6. A semiconductor integrated circuit device as claimed in claim 1, wherein said third wire is a test wire to be used only during a test.

7. A semiconductor integrated circuit device comprising:
   a first wire for transmitting a first signal;
   a second wire, adjacent to said first wire, said second wire having a capability for transmitting a second signal having an opposite phase to that of said first signal;
   a space formed between said first and second wires, said space being sufficiently large to reduce a delay in the operation speed of said semiconductor integrated circuit device due to wiring capacitance produced between said first and second wires; and
   a third wire capable of transmitting a third signal having the same phase as the first signal,
   said first and third wires being arranged adjacent to each other.

8. A semiconductor integrated circuit device as claimed in claim 7, wherein said first wire transmits an OR or a NOR output of a first OR/NOR gate, and said third wire transmits an OR or a NOR output of a second OR/NOR gate that receives the same signal as that supplied to said first OR/NOR gate.

9. A semiconductor integrated circuit device as claimed in claim 7, wherein said first wire transmits an AND or a NAND output of a first AND/NAND gate, and said third wire transmits an AND or a NAND output of a second AND/NAND gate that receives the same signal as said first AND/NAND gate.

10. A semiconductor integrated circuit device as claimed in claim 7, wherein said semiconductor integrated circuit device has a multilayer wiring structure, said first and third wires being arranged in adjacent wiring layers.

11. A semiconductor integrated circuit device as claimed in claim 7, wherein the first signal and second signal are complementary signals.

12. A semiconductor integrate circuit device as claimed in claim 11, wherein the complementary signals are complementary clock signals.

13. A semiconductor integrated circuit device as claimed in claim 11, wherein the complementary signals are OR and NOR outputs of an OR/NOR gate.

14. A semiconductor integrated circuit device as claimed in claim 11, wherein the complementary signals are AND and NAND outputs of an AND/NAND gate.

15. A semiconductor integrated circuit device having a plurality of wires, two of said wires of said plurality being arranged as a first pair of wires for transmitting signals having opposite phases, two of said wires of said plurality being arranged as a second pair of wires for transmitting signals having the same phase, there being a space between the wires of each pair of wires, the space between the wires of said first pair of wires being wider than the space between the wires of said second pair of wires.

* * * * *